US010332664B2

(12) United States Patent
Stemmle et al.

(10) Patent No.: US 10,332,664 B2
(45) Date of Patent: Jun. 25, 2019

(54) ARRANGEMENT FOR CURRENT LIMITATION WHICH IS SUITABLE FOR INTEGRATION INTO A POWER SUPPLY SERVING NETWORK

(71) Applicant: NEXANS, Paris (FR)

(72) Inventors: Mark Stemmle, Hannover (DE); Beate West, Hannover (DE)

(73) Assignee: NEXANS, Courbevoie (FR)

( * ) Notice: Subject to any disclaimer, the term of this patent is extended or adjusted under 35 U.S.C. 154(b) by 113 days.

(21) Appl. No.: 15/213,882

(22) Filed: Jul. 19, 2016

(65) Prior Publication Data

US 2017/0025209 A1    Jan. 26, 2017

(30) Foreign Application Priority Data

Jul. 21, 2015  (EM) ............................... 15 306 183.3

(51) Int. Cl.
| | |
|---|---|
| *H01F 6/06* | (2006.01) |
| *H01F 6/04* | (2006.01) |
| *H01L 39/16* | (2006.01) |

(52) U.S. Cl.
CPC .............. *H01F 6/04* (2013.01); *H01F 6/06* (2013.01); *H01L 39/16* (2013.01)

(58) Field of Classification Search
CPC ............................. H01F 27/323; H01F 27/245
USPC ................................................ 336/206, 216
See application file for complete search history.

(56) References Cited

U.S. PATENT DOCUMENTS

| | | | | |
|---|---|---|---|---|
| 5,436,606 A | * | 7/1995 | Cottevieille | .............. H01F 6/06 335/216 |
| 6,522,236 B1 | | 2/2003 | Ries et al. | |
| 8,304,650 B2 | * | 11/2012 | Stemmle | ................ H01B 12/06 174/125.1 |
| 2001/0026426 A1 | | 10/2001 | Heismann et al. | |
| 2004/0251999 A1 | * | 12/2004 | Darmann | .................. H01F 6/06 336/180 |
| 2008/0070788 A1 | * | 3/2008 | Kramer | .................... H01L 39/16 505/191 |
| 2008/0303606 A1 | * | 12/2008 | Liu | ..................... H01F 17/0013 333/25 |
| 2009/0086386 A1 | * | 4/2009 | Sargent | ................... H01L 39/16 361/19 |

(Continued)

FOREIGN PATENT DOCUMENTS

| | | |
|---|---|---|
| DE | 110985 | 1/1975 |
| JP | 06303797 A  * | 10/1994 |

(Continued)

OTHER PUBLICATIONS

Search Report dated Dec. 22, 2015.

*Primary Examiner* — Tszfung J Chan
(74) *Attorney, Agent, or Firm* — Sofer & Haroun, LLP

(57) ABSTRACT

An arrangement for current limitation which is suitable for integration in a power supply serving network and which has a superconductive conductor, which is attached to at least one plate like support composed of insulation material. On the at least one support three separate from each other superconductive conductors in spiral form windings parallel to each other running to a separate connection is arranged on the phases of a three phase alternating current network. The support equipped with the phase conductors is built in to a container constructed as a cryostat.

4 Claims, 1 Drawing Sheet

(56) References Cited

U.S. PATENT DOCUMENTS

2010/0309590 A1* 12/2010 Darmann .................. H01F 6/00
                                                        361/19
2011/0116198 A1*  5/2011 Kramer ..................... H01F 6/06
                                                        361/58
2013/0255991 A1  10/2013 Snitchler et al.

FOREIGN PATENT DOCUMENTS

JP   WO 2014126006 A1 *  8/2014  ............. H02H 7/001
WO   WO 2014126006       8/2014

* cited by examiner

ARRANGEMENT FOR CURRENT LIMITATION WHICH IS SUITABLE FOR INTEGRATION INTO A POWER SUPPLY SERVING NETWORK

RELATED APPLICATION

This application claims the benefit of priority from European Patent Application No. 15 306 183.3, filed on Jul. 21, 2015, the entirety of which is incorporated by reference.

BACKGROUND

Field of the Invention

The invention relates to an arrangement for current limitation which is suitable for integration into a power supply serving network and which has a superconductive conductor, which is attached to at least one plate like support composed of insulation material.

Description of Related Art

One such arrangement is known and is described in for example, BP 0 503 448 A2, DE 10 2004 048 646 B4 and DE 10 2006 029 722 B3. It serves to prevent short circuits in the power supply serving network. In addition, the properties of the superconductive materials will be utilized, which will be superconductive at sufficiently low temperatures and by exceeding a certain current strength, the critical current strength is transformed to the normal conductive state. The DC resistance of a superconductive conductor is zero by sufficient cooling, as long as the critical current strength is not exceeded. Suitable materials are, for example, oxide materials on the basis of rare earths (ReBCO) especially YBCO (yttrium-barium-copper-oxide) or BSCCO (bismuth-strontium-calcium-copper-oxide). Sufficiently low temperatures to bring such materials into the superconductive state lie, tor example, between 67K and 110K.

With the occurrence of a short circuit the critical current strength of a superconductive conductor is exceeded, whereby the transition from the superconductive state, with an accompanying negligible small electrical resistance of the material, into the normal conductive state, is accompanied with very high electrical resistance of the materials. Furthermore, in the normal conductive state the materials will heat up through its resistive losses and the electrical resistance increases. The transition of the materials from the superconductive into the normal conductive state takes place by exceeding the critical current strength very quickly, typically in the span of a few milliseconds. As a result, by the placement of one the known arrangements, quickly an electrical resistance in the network is switched on, which limits the short circuit, as a result the network and the arrangement itself are protected from a high current short circuit.

The known arrangement according to the previously mentioned document describes a superconductive conductor with bifilar construction arranged on sheath like supports. In dependence on the required conductor length, a suitable number of such supports are arranged in a housing acting as a cryostat. In the mounted position, for each phase of an alternating current such a cryostat would be used. The manufacture of the bifilar arranged superconductive conductor equipped with supports is costly. There, for each phase of the alternating current a correspondingly constructed cryostat would be used, whose space requirement for the construction is relatively large, especially then, when it concerns a three phase alternating current.

OBJECTS AND SUMMARY

The invention is based on the object to simplify the previously describe arrangement as well as in its construction and also its handling.

This object according to the invention is met in that on at least one support with three separate from each other superconductive phase conductors, in spiral form winding, parallel to each other, are arranged extending to a separate connection to the phases of a three phase alternating current, and that the at least one support, equipped with three phase conductors separate from each other, is built into a container constructed as a cryostat.

This arrangement is connectable as a compact one-piece unit to a three phase alternating current, and in fact, over two electrical contact points for each phase conductor of the arrangement. The completion of the arrangement is relatively simple because the three phase conductors themselves, only in spiral form winding parallel to each other, must be arranged on each support. They can, on their ends, possibly be connected simply with further phase conductor arranged supports. At the same time, simple connecting conductors are sufficient, which are attached between the ends of the phase conductor of a support and the beginning of the phase conductor of a further support. The arrangement, independent of the number of phase conductor equipped supports built in only one container constructed as a cryostat, which with little effort, can be transported to the mounting area and there, compared to the known arrangement, can be set up with less space needed. Because all the necessary superconductive phase conductors can be brought together in only one cryostat for the arrangement, altogether less material is necessary for repairing the superconductive materials.

Between the phase conductors of each of the supports a spacer, which is stable to electrical voltage, can advantageously be arranged, which preferably is composed of reinforced fiberglass synthetic.

BRIEF DESCRIPTION OF THE DRAWINGS

An embodiment of the present subject matter is illustrated in the drawings.

In the drawings.

DETAILED DESCRIPTION

Figure 1:
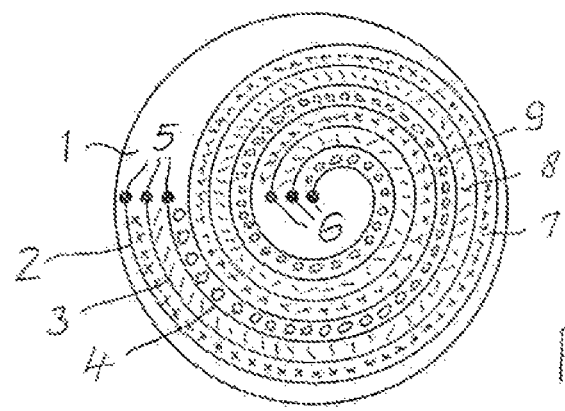
FIG. 1 is a top view of the arrangement according to the invention schematically illustrated.

On a plate like support 1 composed of a mechanically stable synthetic material, such as for example reinforced fiberglass synthetic, are three superconductive phase conductors 2, 3 and 4 arranged and fastened on the same. The phase conductors 2, 3 and 4 run in a spiral form winding parallel to each other. They are arranged on the upper surface of the support 1 so that the upper surface of the support is generally covered. The ends of phase conductors 2, 3 and 4 are advantageously connected on the one side with contact element 5 and on the other side with contact element 6.

Between the windings of the phase conductors 2, 3 and 4 are arranged spacers 7, 8 and 9, which is stable to electrical voltage, composed of insulation material, corresponding with the illustrated embodiment, which through crosses and dashes as well as circles indicate the different parts. They are composed of for example, reinforced fiberglass synthetic. Each of the phase conductors 2, 3 and 4 can also be surrounded by an electrical insulation material.

Figure 2:
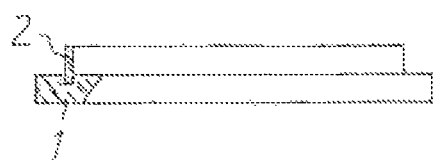
FIG. 2 is a side view of the arrangement according to FIG. 1.

Each phase conductor 2, 3 or 4 has a superconductive conductor, which advantageously is constructed as a band and can be arranged upright on the respective support 1. For this purpose, a groove is available for each phase conductor in the support 1 which runs in the predetermined spiral form winding and engages on each conductor. This is schematically illustrated in FIG. 2. In that respect, on each support 1 are fixed phase conductors 2, 3 and 4 which can be used as insulation medium, for example, also cooling medium, for example, liquid nitrogen, which is available in a cryostat, in which in the inner space of the finished arrangement at least one corresponding equipped support 1 is used according to the previous description.

For each embodiment, to maintain sufficient length of the phase conductor 2, 3 and 4, advantageously a sufficient number of arrangements according to FIG. 1 and FIG. 2 are switched in an electric series. As a result, the arrangement, according to FIG. 2 for example, can be arranged in a container 10 lying over each other which vacuum insulates and thereby functions as a cryostat. In the container 10 in FIG. 3 five arrangements according to FIG. 2 are illustrated, which are separated from each other by the layer between.

Figure 3:
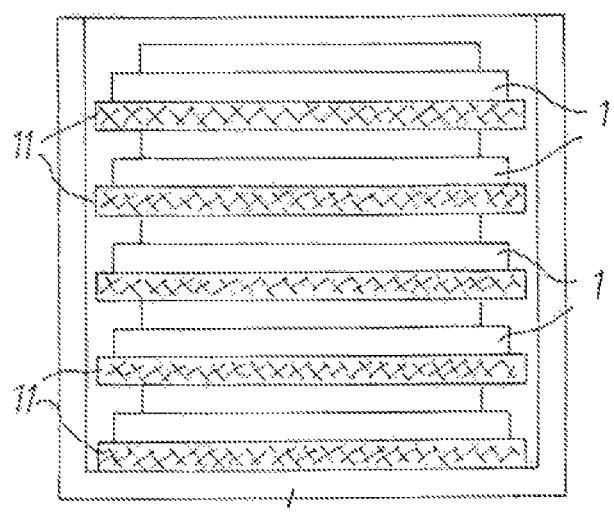
FIG. 3 is several arranged arrangements in a container according to FIG. 1.

According to FIG. 3 an example of a built up container 10 or cryostat can be transported to the assembly location and there attached to a three phase alternating current network. The phase conductors 2, 3 and 4 would then, before processing, be cooled to a temperature by which the superconductive material changes to the superconductive state.

The invention claimed is:

1. An arrangement for current limitation which is suitable for integration in a power supply serving network and which has superconductive conductors, which are mounted on at least one plate like support composed of insulation material,
   wherein at least one of said support carries three superconductive phase conductors, which each have the superconductive conductors, said three superconductive phase conductors being arranged in spiral form winding, parallel to each other and separated from each other by spacers, which are stable to electrical voltage, and the three superconductive phase conductors being provided for a separate connection to the phases of a three phase alternating current network, and
   wherein said at least one support equipped with the three separate phase conductor is mounted within only one container, vacuum insulated and constructed as a cryostat.

2. Arrangement according to claim 1, wherein the phase conductor with the spiral form windings is fixed on the at least one support, and that a cooling medium is arranged as an insulation medium between the phase conductors.

3. Arrangement according to claim 1, wherein each of the phase conductors is surrounded by electrical insulation material.

4. Arrangement according to claim 2, wherein said cooling medium is liquid nitrogen.

* * * * *